US012608058B2

(12) United States Patent
Hu et al.

(10) Patent No.: US 12,608,058 B2
(45) Date of Patent: Apr. 21, 2026

(54) AIR CONDITIONING DEVICE OF VR HEAD-MOUNTED EQUIPMENT

(71) Applicant: Shenzhen Xiaozhai Technology Co., Ltd., Shenzhen (CN)

(72) Inventors: Xiaomin Hu, Shenzhen (CN); Zhiwu Zou, Shenzhen (CN)

(73) Assignee: Shenzhen Xiaozhai Technology Co., Ltd., Shenzhen (CN)

( * ) Notice: Subject to any disclaimer, the term of this patent is extended or adjusted under 35 U.S.C. 154(b) by 144 days.

(21) Appl. No.: 18/430,731

(22) Filed: Feb. 2, 2024

(65) Prior Publication Data

US 2024/0168530 A1 May 23, 2024

(30) Foreign Application Priority Data

Jan. 18, 2024 (CN) .......................... 202420129403.5

(51) Int. Cl.
| | |
|---|---|
| *H05K 7/20* | (2006.01) |
| *G02B 27/01* | (2006.01) |
| *G06F 1/16* | (2006.01) |
| *G06F 1/20* | (2006.01) |
| *A63F 13/26* | (2014.01) |

(52) U.S. Cl.
CPC ......... *G06F 1/203* (2013.01); *G02B 27/0176* (2013.01); *G06F 1/163* (2013.01); *H05K 7/20136* (2013.01); *A63F 13/26* (2014.09); *A63F 2300/8082* (2013.01)

(58) Field of Classification Search
CPC ........ G06F 1/16; G06F 1/1601; G06F 1/1607;

G06F 1/163; G06F 1/1637; G06F 1/1641; G06F 1/1652; G06F 1/1658; G06F 1/1683; G06F 1/18; G06F 1/183; G06F 1/184; G06F 1/185; G06F 1/203; H05K 5/0247; H05K 5/0026; H05K 5/02; H05K 7/02; H05K 7/20136; G02F 1/133305; G02F 1/133308; G02F 1/133314; G02F 1/133317; G02F 1/13332; G02F 1/13452;

(Continued)

(56) References Cited

U.S. PATENT DOCUMENTS

| | | | | |
|---|---|---|---|---|
| 3,548,415 A | * | 12/1970 | Waters | A42B 3/286 |
| | | | | 165/47 |
| 3,813,696 A | * | 6/1974 | Yeager | A42B 3/286 |
| | | | | 416/63 |

(Continued)

FOREIGN PATENT DOCUMENTS

| | | | | |
|---|---|---|---|---|
| CN | 106038039 A | * | 10/2016 | A61F 7/02 |
| CN | 216817086 U | * | 6/2022 | |

(Continued)

*Primary Examiner* — Gage Crum
(74) *Attorney, Agent, or Firm* — Hemisphere Law, PLLC

(57) ABSTRACT

The present disclosure relates to the field of head-mounted equipment and discloses an air conditioning device of virtual reality (VR) head-mounted equipment. The air conditioning device includes a forehead-mounted piece configured to be worn on the forehead of the head of a user. By the arrangement of the air exchange fan inside the inner cavity, an effect of air circulation between the forehead of the user and an external air flow is achieved, so that effects of heat dissipation, ventilation, and air exchange are achieved; and stuffiness and lens fogging difficultly occur.

11 Claims, 6 Drawing Sheets

(58) Field of Classification Search
CPC ... A61F 9/028; G02B 27/017; G02B 27/0176;
A42B 1/008; A42B 3/286; F04D 25/084
USPC .................................................... 361/679.01
See application file for complete search history.

(56) References Cited

U.S. PATENT DOCUMENTS

| | | | | |
|---|---|---|---|---|
| 5,561,862 | A | * | 10/1996 | Flores, Sr. .............. A42B 3/286 |
| | | | | 2/422 |
| 6,409,338 | B1 | * | 6/2002 | Jewell .................... G02C 11/10 |
| | | | | 351/158 |
| 6,760,925 | B1 | * | 7/2004 | Maxwell ................ A42B 3/285 |
| | | | | 2/7 |
| 9,861,142 | B1 | * | 1/2018 | Rebecchi .............. F04D 29/403 |
| 9,980,416 | B2 | * | 5/2018 | Reynolds ........... G02B 27/0176 |
| 10,492,346 | B2 | * | 11/2019 | Selvakumar ....... G02B 27/0006 |
| 11,409,344 | B1 | * | 8/2022 | Chen ...................... A42B 3/286 |
| 11,737,218 | B2 | * | 8/2023 | Chang .................. H05K 5/0217 |
| | | | | 361/807 |
| 11,762,208 | B1 | * | 9/2023 | Dias ......................... G06F 1/206 |
| | | | | 345/8 |

| | | | | |
|---|---|---|---|---|
| 2010/0017941 | A1 | * | 1/2010 | Taylor .................... A42B 1/008 |
| | | | | 2/209.13 |
| 2013/0142656 | A1 | * | 6/2013 | Hamilton .............. F04D 27/004 |
| | | | | 416/204 R |
| 2014/0359917 | A1 | * | 12/2014 | Benson .................. A42B 3/286 |
| | | | | 2/171.3 |
| 2017/0139212 | A1 | * | 5/2017 | Choi ........................ G06F 1/163 |
| 2020/0345971 | A1 | * | 11/2020 | Schrim ...................... A61F 7/02 |
| 2021/0127769 | A1 | * | 5/2021 | Zombek ................. F25B 21/02 |
| 2021/0303024 | A1 | * | 9/2021 | Kuo ........................ G06F 1/203 |
| 2021/0355960 | A1 | * | 11/2021 | Liu ..................... F04D 25/0673 |
| 2021/0385954 | A1 | * | 12/2021 | Chang ................. H05K 5/0217 |
| 2022/0107102 | A1 | | 4/2022 | Saxby |
| 2022/0142283 | A1 | * | 5/2022 | Hashimoto .......... A61B 5/4266 |
| 2022/0266652 | A1 | | 8/2022 | Eisner et al. |
| 2023/0160614 | A1 | | 5/2023 | Kim et al. |
| 2024/0094547 | A1 | * | 3/2024 | Dunsmoor ......... H05K 7/20181 |
| 2024/0309879 | A1 | * | 9/2024 | Xie ....................... F04D 25/166 |

FOREIGN PATENT DOCUMENTS

| | | | | | |
|---|---|---|---|---|---|
| CN | 217658331 | U | * | 10/2022 | |
| CN | 217658352 | U | * | 10/2022 | |
| JP | 2008101278 | A | * | 5/2008 | ............. A42B 3/285 |

* cited by examiner

1

11

121

AIR CONDITIONING DEVICE OF VR HEAD-MOUNTED EQUIPMENT

TECHNICAL FIELD

The present disclosure relates to the technical field of VR head-mounted equipment, and in particular, to an air conditioning device of a virtual-reality (VR) head-mounted equipment.

BACKGROUND

At present, when a VR product is used, facial air circulation mainly relies on ventilation holes or arranging a heat dissipation mechanism outside a VR headband. If a ventilation channel is wide and straight through, light is easily transmitted, which affects the VR watching effect. If the ventilation channel is light-proof, the ventilation performance is also poor, and stuffiness, lens fogging, and the like are easily caused. Mounting the heat dissipation mechanism outside the headband is complicated, and the heat dissipation and ventilation effects are poor. The product is mounted by buckle connection, which leads to poor airtightness due to poor connection or disassembling handfeel and defective tightness.

SUMMARY

The present disclosure aims to provide an air conditioning device of a VR head-mounted equipment, so as to solve the problems of poor air exchange performance of the VR head-mounted equipment and the influence caused by easy light transmittance on the VR watching effect.

The present disclosure provides an air conditioning device of VR head-mounted equipment. The air conditioning device includes a forehead-mounted piece configured to be worn on the forehead of the head of a user; the forehead-mounted piece includes a curved outer shell and a curved inner shell; the inner shell is fixed on the outer shell; an inner cavity is formed between the outer shell and the inner shell; an air exchange fan is arranged inside the inner cavity; an air exchange hole is arranged on the outer shell; the air exchange hole is communicated to the inner cavity; a first air outlet channel is formed between a top of the outer shell and a top of the inner shell; the first air outlet channel is communicated to the inner cavity; a second air outlet channel is formed between a bottom of the outer shell and a bottom of the inner shell; and the second air outlet channel is communicated to the inner cavity.

Further, the inner shell is composed of a plurality of sequentially arranged splicing parts, and the splicing parts are fixedly connected to corresponding positions of the outer shell corresponding to the splicing parts.

Further, the first air outlet channel is generated by a gap formed on one side close to the forehead when the outer shell is assembled with the inner shell, and extends in a lengthwise direction of the forehead-mounted piece.

Further, the second air outlet channel is generated by a gap formed on one side close to the checks when the outer shell is assembled with the inner shell, and extends in a lengthwise direction of the checks of two sides.

Further, the air exchange fan comprises a rotatable fan blade and a motor driving the fan blade to rotate.

Further, the inner shell has a mounting end face facing away from the outer shell; a soft cushion layer is mounted on the mounting end face; and the soft cushion layer abuts tightly against the forehead of the head of the user to improve the comfort of a user.

Further, the splicing parts are fixedly connected to the outer shell through a connecting structure.

Further, the connecting structure includes a threaded column arranged on the outer shell, a screw hole arranged on the inner shell, and a fixing screw; the screw passes through the screw hole and is in threaded connection to the threaded column to achieve a fixed connection between the outer shell and the splicing parts.

Further, a protective frame is arranged at the air change hole, and the protective frame is configured to prevent the user from accidentally touching the air exchange fan.

Compared with the prior art, according to the air conditioning device of the VR head-mounted equipment, the inner cavity is formed between the outer shell and the inner shell of the forehead-mounted piece; the inner cavity is communicated to external air through a ventilation hole; the inner cavity is further communicated to an air flow of the forehead of the user through the first air exchange channel and the second air exchange channel; the air exchange fan is arranged in the inner cavity, so that an effect of air circulation between the forehead of the user and an external air flow is achieved, and effects of heat dissipation, ventilation, and air exchange are achieved; and stuffiness and lens fogging difficultly occur. Furthermore, the first air exchange channel and the second air exchange channel do not directly face external light, and the first air exchange channel and the second air exchange channel are slotted, which will avoid the influence caused by light transmittance on the VR watching effect.

DETAILED DESCRIPTION OF THE EMBODIMENTS

Figure 1:
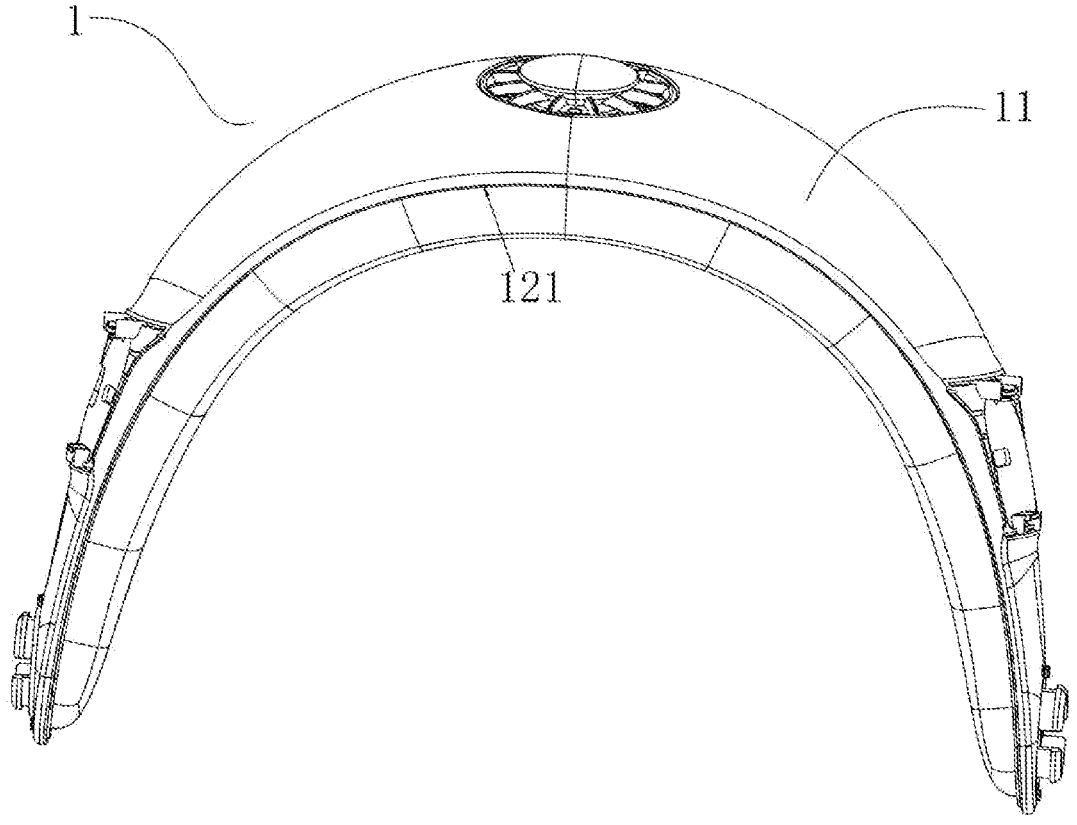
FIG. 1 is a three-dimensional diagram of an air conditioning device of VR head-mounted equipment according to an embodiment of the present disclosure.
Figure 2:
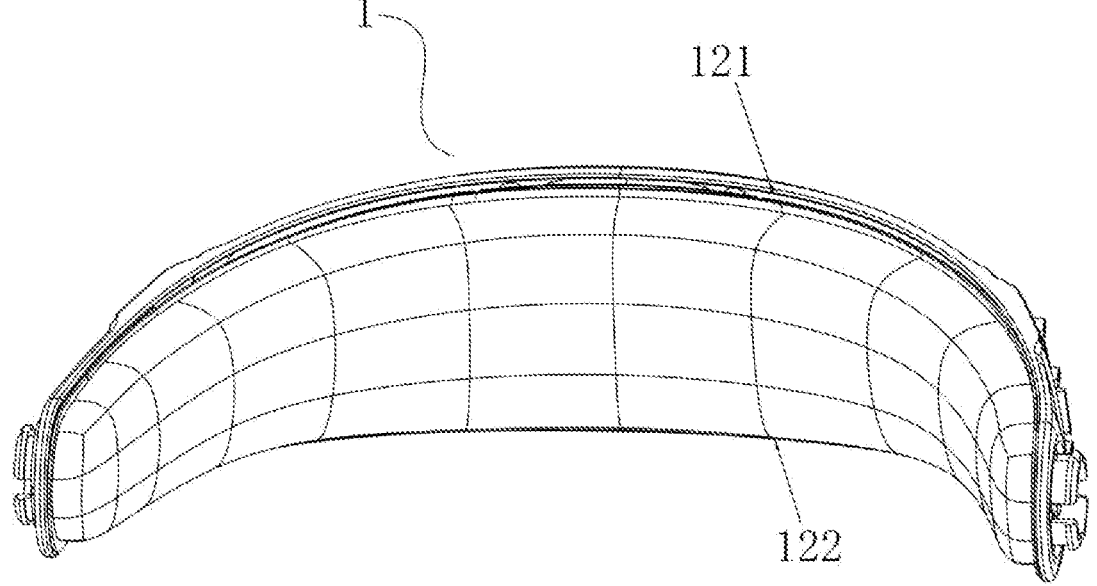
FIG. 2 is a three-dimensional diagram of an air conditioning device of VR head-mounted equipment according to an embodiment of the present disclosure.
Figure 3:
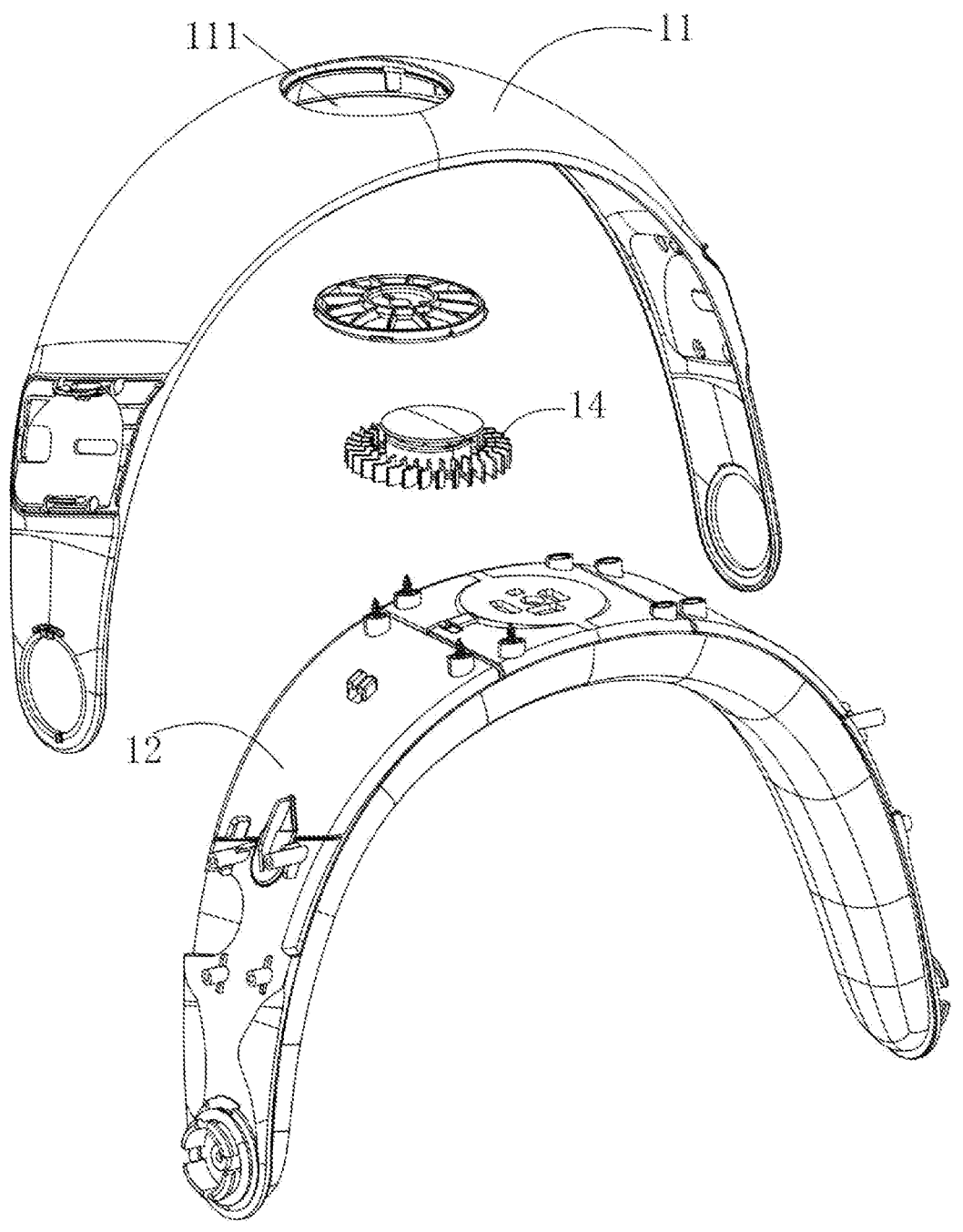
FIG. 3 is an exploded diagram of an air conditioning device of VR head-mounted equipment according to an embodiment of the present disclosure.
Figure 4:
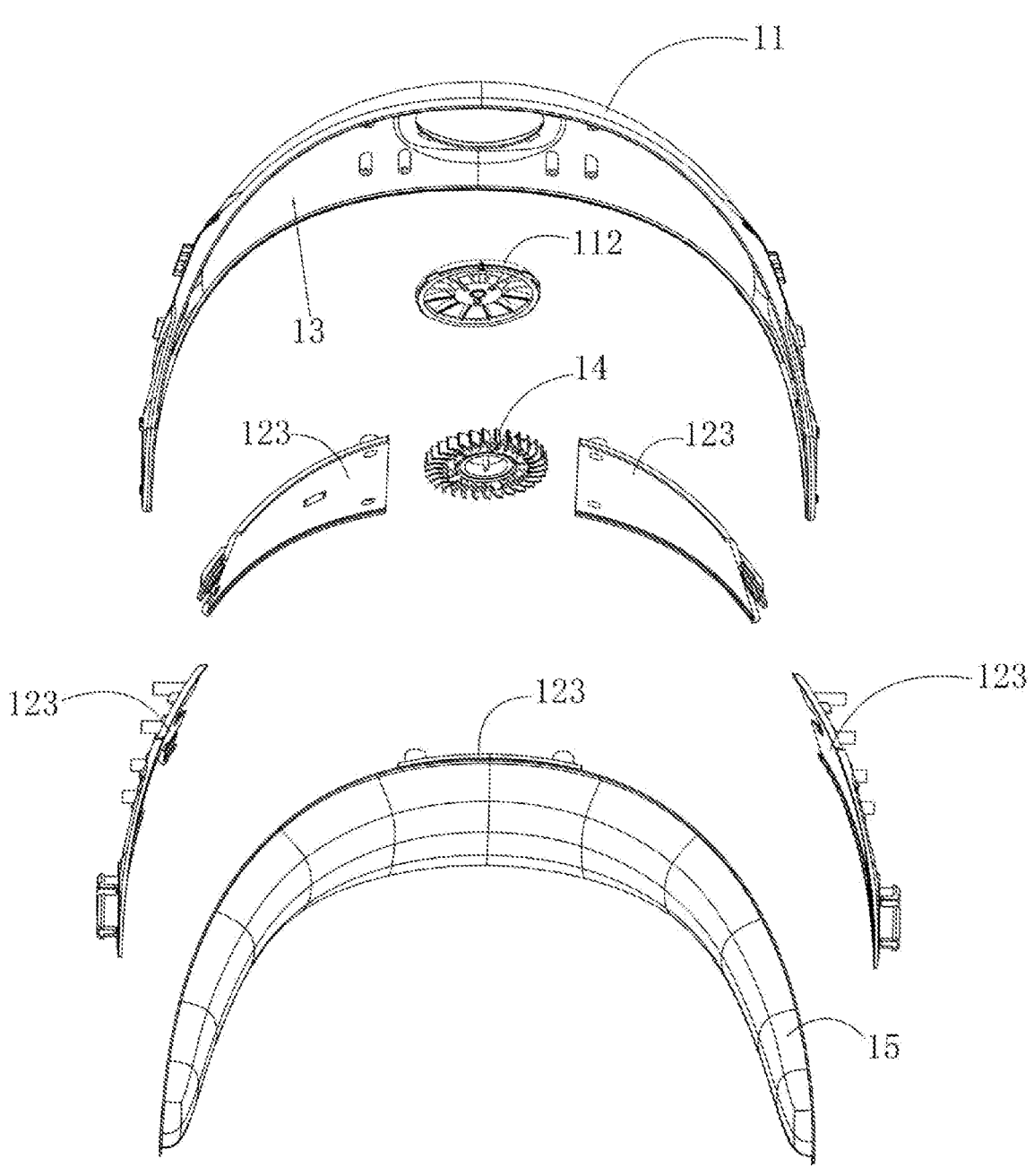
FIG. 4 is an exploded diagram of an air conditioning device of VR head-mounted equipment according to an embodiment of the present disclosure.

The embodiments of the present disclosure are described in detail below, and examples of the embodiments are shown in accompanying drawings, where the same or similar elements or the elements having same or similar functions are denoted by the same or similar reference numerals throughout the description. The embodiments described below with reference to the accompanying drawings are exemplary and used only for explaining the present disclosure, and should not be construed as a limitation on the present disclosure.

The implementation of the present disclosure will be described in detail below in combination with specific embodiments.

Referring to FIG. 1 to FIG. 4, an air conditioning device of VR head-mounted equipment includes a forehead-mounted piece 1 configured to be worn on the forehead of the head of a user; the forehead-mounted piece 1 includes a curved outer shell 11 and a curved inner shell 12; the inner shell 12 is fixed on the outer shell 11; an inner cavity 13 is formed between the outer shell 11 and the inner shell 12; an air exchange fan 14 is arranged inside the inner cavity 13; an air exchange hole 111 is arranged on the outer shell 11; the air exchange hole 111 is communicated to the inner cavity 13; a first air outlet channel 121 is formed between a top of the outer shell 11 and a top of the inner shell 12; the first air outlet channel 121 is communicated to the inner cavity 13; a second air outlet channel 122 is formed between a bottom of the outer shell 11 and a bottom of the inner shell 12; and the second air outlet channel 122 is communicated to the inner cavity 13.

According to the air conditioning device of the VR head-mounted equipment, the inner cavity 13 is formed between the outer shell 11 and the inner shell 12 of the forehead-mounted piece 1; the inner cavity 13 is communicated to external air through a ventilation hole; the inner cavity 13 is further communicated to air flows of the forehead of the user and the cheeks of the two sides through the first air exchange channel and the second air exchange channel; the air exchange fan 14 is arranged in the inner cavity 13, so that an effect of air circulation between the forehead of the user and an external air flow is achieved, and effects of heat dissipation, ventilation, and air exchange are achieved; and stuffiness and lens fogging difficultly occur. Furthermore, the first air exchange channel and the second air exchange channel do not directly face external light, and the first air exchange channel and the second air exchange channel are slotted, which will avoid the influence caused by light transmittance on the VR watching effect.

Further, the inner shell 12 is composed of a plurality of sequentially arranged splicing parts 123, and the splicing parts 123 are fixedly connected to corresponding positions of the outer shell 11 corresponding to the splicing parts. Due to the fact that the forehead-mounted piece 1 is worn on the forehead of the user, in order to adapt to head sizes of different users, the forehead-mounted piece 1 often needs to undergo curving deformation. The inner shell 12 and the outer shell 11 are fixed. If the inner shell 12 is integrally formed, when the two shells deform, the inner shell 12 is easy to damage due to the deformation. The inner shell 12 of the present disclosure is spliced, so that this problem can be effectively solved.

Figure 5:
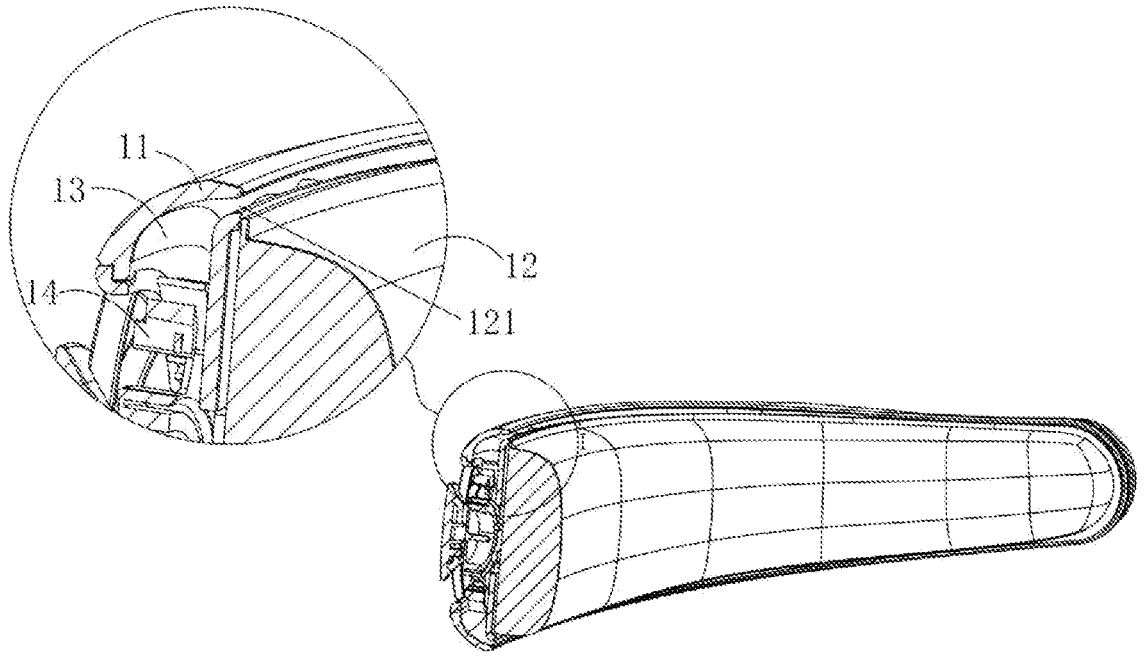
FIG. 5 is a schematic diagram I of a cross-sectional structure of an air conditioning device of VR head-mounted equipment according to an embodiment of the present disclosure.
Figure 6:
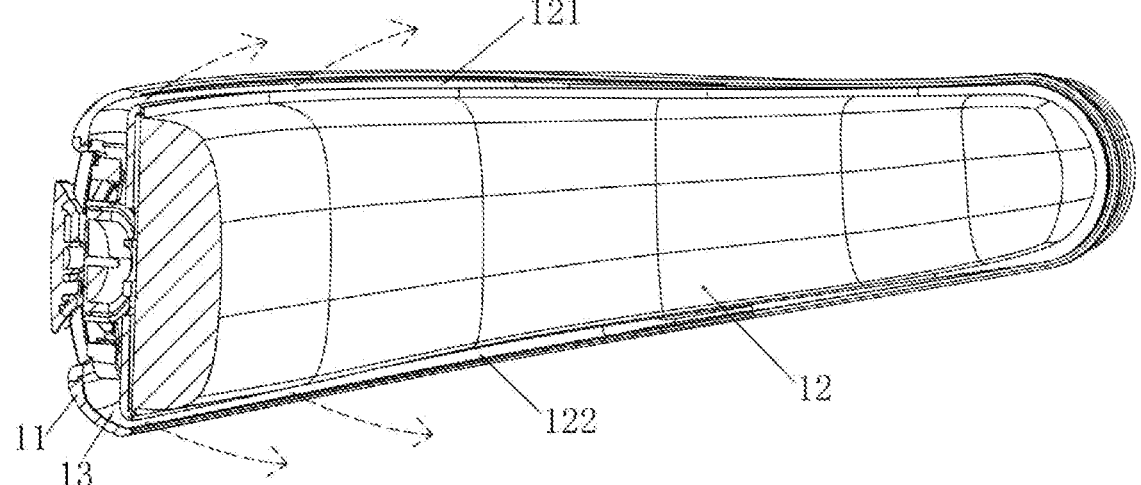
FIG. 6 is a schematic diagram II of a cross-sectional structure of an air conditioning device of VR head-mounted equipment according to an embodiment of the present disclosure (wherein the arrow direction represents an air blowing direction).

Referring to FIG. 5 to FIG. 6, the first air outlet channel 121 is generated by a gap formed on one side close to the forehead when the outer shell 11 is assembled with the inner shell 12, and extends in a lengthwise direction of the forehead-mounted piece. This layout form makes the first air outlet channel 121 elongated, which improves the heat dissipation and air outlet effect of all parts of the forehead; air discharging is uniform; and the influence caused by light transmittance on the VR watching effect is avoided.

Referring to FIG. 5 to FIG. 6, the second air outlet channel 122 is generated by a gap formed on one side close to the cheeks when the outer shell 11 is assembled with the inner shell 12, and extends in a lengthwise direction of the cheeks of two sides. This layout form makes the first air outlet channel 122 elongated, which improves the heat dissipation and air outlet effect of all parts of the forehead; air discharging is uniform; and the influence caused by light transmittance on the VR watching effect is avoided.

It should be understood that in the heat dissipation principle of this patent of the present disclosure, the air exchange fan belongs to a centrifugal fan, which diffuses air to a periphery centrifugally, so that the air is blown into the inner cavity by the centrifugal fan, and is then diffused from the inner cavity to the first air outlet channel and the second air outlet channel on the upper and lower sides. Therefore, local skin cooling is used to cool a surrounding area, so that the user will not feel stuffy in a part, such as sponge, which abuts tightly against the soft cushion layer. The upper and lower air outlets will form two cooling areas at the top and the front part, which achieves a wider acting area.

Specifically, the air exchange fan 14 includes a rotatable fan blade and a motor driving the fan blade to rotate.

Specifically, the inner shell 12 has a mounting end face facing away from the outer shell 11; a soft cushion layer 15 is mounted on the mounting end face; and the soft cushion layer 15 abuts tightly against the forehead of the head of the user to improve the comfort of a user.

Further, the splicing parts 123 are fixedly connected to the outer shell 11 through a connecting structure.

Specifically, the connecting structure includes a threaded column arranged on the outer shell 11, a screw hole arranged on the inner shell 12, and a fixing screw; the screw passes through the screw hole and is in threaded connection to the threaded column to achieve a fixed connection between the outer shell 11 and the splicing parts 123.

Further, a protective frame 112 is arranged at the air change hole 111, and the protective frame 112 is configured to prevent the user from accidentally touching the air exchange fan 14.

In a preferred use method of the present disclosure, for wearing, elastic bands for binding are arranged on two. Of course, the air conditioning device can also be worn after being connected to other host unit products. As an expandable embodiment in the future, the head-mounted equipment of the present disclosure controls the fan to rotate through an app, which achieves control of interconnection with intelligent equipment.

The embodiments of the present disclosure have been shown and described above, but it can be understood that the above embodiments are exemplary and cannot be understood as limitations on the present disclosure. A person of ordinary skill in the art may make changes, modifications, substitutions, and transformations to the above embodiments within the scope of the present disclosure.

What is claimed is:

1. An air conditioning device of virtual reality (VR) head-mounted equipment, wherein the air conditioning device comprises a forehead-mounted piece configured to be worn on a forehead of a user; the forehead-mounted piece comprises:

a curved outer shell fixed on a curved inner shell;

an inner cavity formed between the outer shell and the inner shell;

an air exchange fan arranged inside the inner cavity;

an air exchange hole arranged at a middle of the outer shell and facing away from the forehead of the user when the forehead-mounted piece is worn by the user, wherein the air exchange hole is in communication with the inner cavity;

a first air outlet channel is formed as a first gap between a top edge of the outer shell and a top edge of the inner shell, wherein the first air outlet channel is in communication with the inner cavity and faces toward the forehead of the user when the forehead-mounted piece is worn by the user;

a second air outlet channel is formed as a second gap between a bottom edge of the outer shell and a bottom edge of the inner shell, wherein the second air outlet channel is in communication with the inner cavity and faces toward the forehead of the user, closer to cheeks of the user, when the forehead-mounted piece is worn by the user; and a cushion layer mounted on the inner shell and configured to contact the forehead of the user when the forehead-mounted piece is worn by the user, wherein the cushion layer establishes an uninterrupted space between the forehead and the first and second air outlet channels to allow air to exit the first and second air outlet channels when the forehead-mounted piece is worn by the user.

2. The air conditioning device of the VR head-mounted equipment according to claim 1, wherein the inner shell is composed of a plurality of sequentially arranged splicing parts, and the splicing parts are fixedly connected to corresponding positions of the outer shell corresponding to the splicing parts.

3. The air conditioning device of the VR head-mounted equipment according to claim 2, wherein the second air outlet channel is generated by the second gap formed on one side of the forehead-mounted piece close to the cheeks of the user when the outer shell is assembled with the inner shell.

4. The air conditioning device of the VR head-mounted equipment according to claim 2, wherein the splicing parts are fixedly connected to the outer shell through a connecting structure.

5. The air conditioning device of the VR head-mounted equipment according to claim 4, wherein the connecting structure comprises a threaded column arranged on the outer shell, a screw hole arranged on the inner shell, and a fixing screw; the fixing screw passes through the screw hole and is in threaded connection to the threaded column to achieve a fixed connection between the outer shell and the splicing parts.

6. The air conditioning device of the VR head-mounted equipment according to claim 1, wherein the first air outlet channel is generated by the first gap formed on one side of the forehead-mounted piece close to the forehead when the outer shell is assembled with the inner shell.

7. The air conditioning device of the VR head-mounted equipment according to claim 6, wherein the second air outlet channel is generated by the second gap formed on one side of the forehead-mounted piece close to the cheeks of the user when the outer shell is assembled with the inner shell.

8. The air conditioning device of the VR head-mounted equipment according to claim 1, wherein the second air outlet channel is generated by the second gap formed on one side of the forehead-mounted piece close to the cheeks when the outer shell is assembled with the inner shell.

9. The air conditioning device of the VR head-mounted equipment according to claim 1, wherein the air exchange fan comprises a rotatable fan blade and a motor driving the fan blade to rotate.

10. The air conditioning device of the VR head-mounted equipment according to claim 1, wherein the inner shell has a mounting end face facing away from the outer shell; the cushion layer is mounted on the mounting end face; and the cushion layer abuts against the forehead of the user to improve comfort of the user.

11. The air conditioning device of the VR head-mounted equipment according to claim 1, wherein a protective frame is arranged at the air change exchange hole, and the protective frame is configured to prevent the user from accidentally touching the air exchange fan.

* * * * *